(12) United States Patent
Kurtsman

(10) Patent No.: US 6,223,908 B1
(45) Date of Patent: May 1, 2001

(54) ADJUSTABLE COMMUNICATIONS EQUIPMENT DUAL RELAY RACK

(75) Inventor: Yakov Kurtsman, Chicago, IL (US)

(73) Assignee: Homaco, Inc., Chicago, IL (US)

( * ) Notice: Subject to any disclaimer, the term of this patent is extended or adjusted under 35 U.S.C. 154(b) by 0 days.

(21) Appl. No.: 09/396,528

(22) Filed: Sep. 15, 1999

(51) Int. Cl.$^7$ .................................................... A47F 5/00
(52) U.S. Cl. ............................ 211/26; 211/175; 211/189; 312/265.1; 312/265.4; 361/829
(58) Field of Search ............................. 211/26, 175, 189, 211/190, 191; 312/265.1, 265.2, 265.3, 265.4, 265.5; 361/829

(56) References Cited

U.S. PATENT DOCUMENTS

| 3,332,558 | 7/1967 | Wilson . | |
|---|---|---|---|
| 3,602,373 | 8/1971 | Cassel . | |
| 4,184,599 | 1/1980 | Drake . | |
| 4,523,722 | 6/1985 | Cohen . | |
| 4,713,949 | 12/1987 | Wilcox . | |
| 4,715,502 | 12/1987 | Salmon . | |
| 4,964,020 | 10/1990 | Savage . | |
| 4,988,008 | 1/1991 | Blum . | |
| 5,165,770 | 11/1992 | Hahn . | |
| 5,372,262 | * 12/1994 | Benson et al. | ......................... 211/26 |
| 5,542,549 | 8/1996 | Siemon . | |
| 5,593,046 | * 1/1997 | Katsuura et al. | ................ 211/175 X |
| 6,065,612 | * 5/2000 | Rinderer | ................................. 211/26 |

* cited by examiner

Primary Examiner—Robert W. Gibson, Jr.
(74) Attorney, Agent, or Firm—Anthony S. Zummer

(57) ABSTRACT

A four-column adjustable communications equipment dual relay rack is the subject matter. The columns are arranged in pairs with each pair of columns defining a vertical plane. Two adjustment brackets connected to columns of opposed pairs and two second adjustment brackets connected to the other columns of the two pairs. The distance between the ends of the adjustment brackets selective to determine the distance between the vertical plans of the pairs of columns.

15 Claims, 3 Drawing Sheets

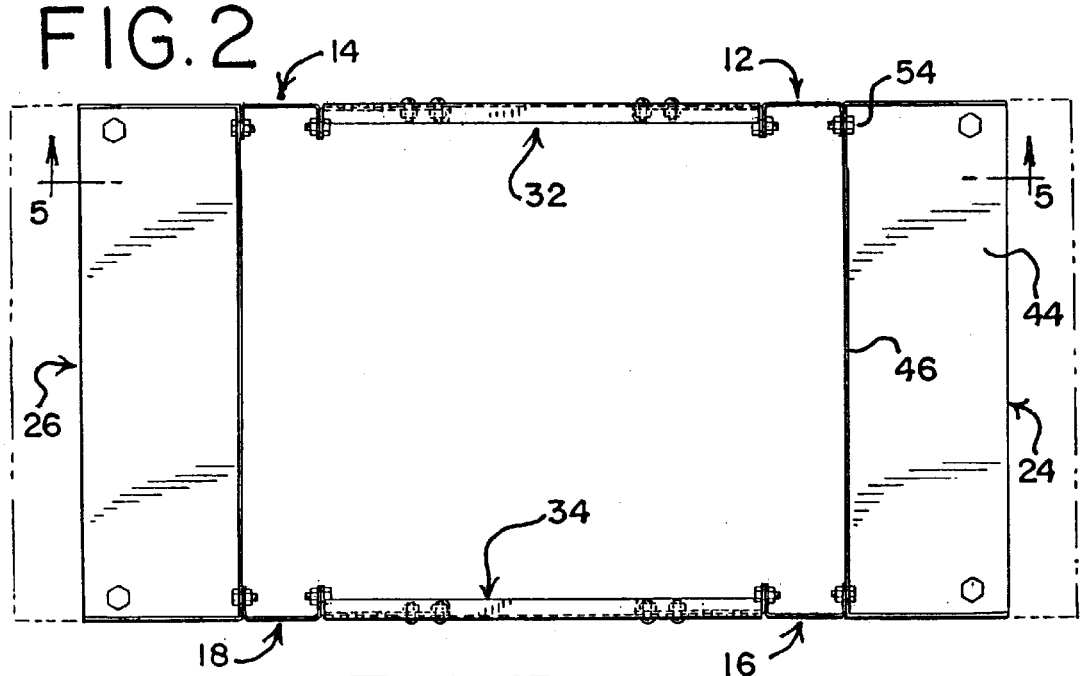
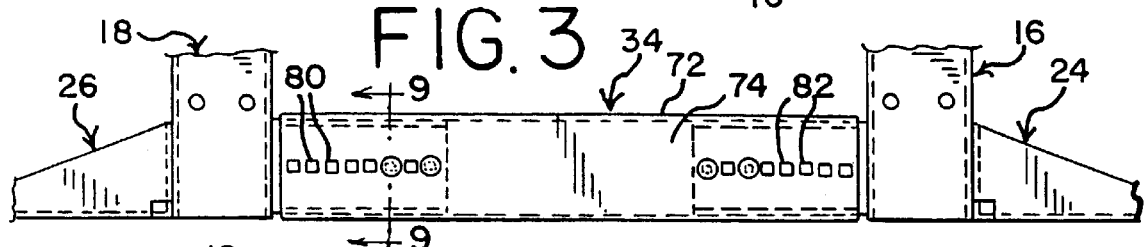
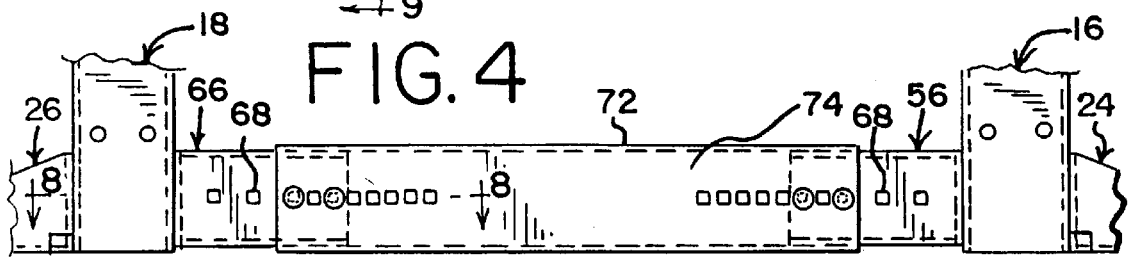
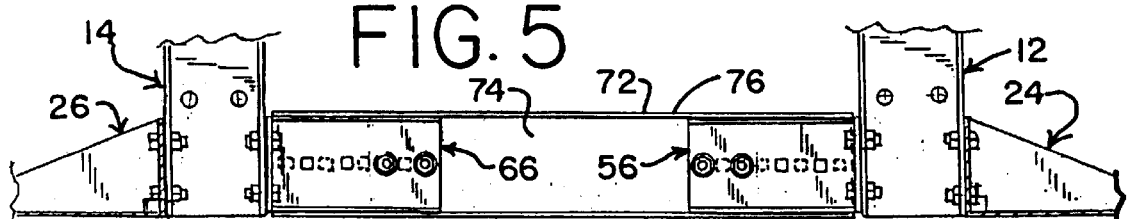
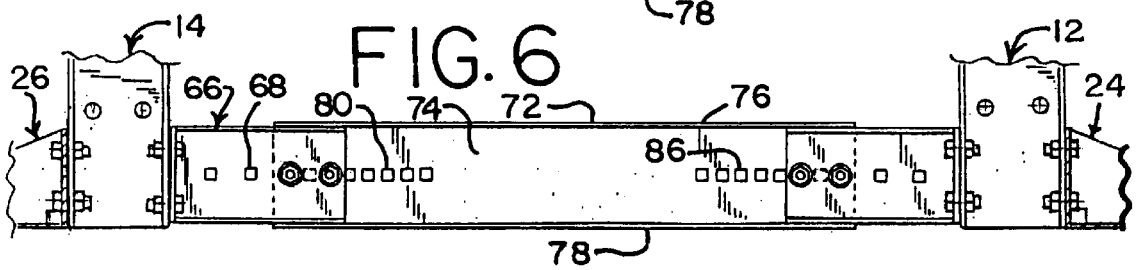

ADJUSTABLE COMMUNICATIONS EQUIPMENT DUAL RELAY RACK

BACKGROUND OF THE INVENTION

The data communications industry has progressively used more and a greater variety of sizes of equipment. Certain equipment is typically mounted on a relay rack. The industry has adopted a standard (ANSI/TIA/EIA-310E, "Cabinets, Racks, Panels and Associated Equipment") for relay racks. The most widely used relay rack in this standard is the "19-inch" relay rack. It has an equipment opening of seventeen and three-quarters inches between the mounting posts. Although the width of the equipment is specified in the '310E standard, the depth is not. The industry utilizes equipment, such as electronic hubs and routers, which can be heavy and have a variety of depths. Typically this heavy and deep equipment has been mounted in cabinets, which have two parallel sets of mounting posts of the standard width so the equipment can be secured on all four corners. The problem is the depth of a given cabinet is fixed and the depth of the equipment is not. It follows that a dual relay rack which has an adjustable depth is desirable, but the width of a relay rack should be the established uniform width. The installation of a dual relay rack for receiving equipment of a variety of depths should be effected by a single workman to provide an economical installation of the relay racks.

SUMMARY OF THE INVENTION

The subject matter here is an adjustable data communications equipment dual relay rack. The dual relay rack includes four spaced apart upright columns which are substantially parallel to each other. The columns define a footprint being a regular four sided figure. The columns are divided into pairs with a column connector bracket connecting the columns of each pair. The column connector brackets are substantially parallel to each other. An adjustment bracket is connected to each of opposed columns of the two pairs of columns. The adjustment brackets are substantially parallel to each other. Each of the adjustment brackets has one end secured to a column of one of the pair of columns and an opposite end secured to an opposed column of the other pair of columns. Each of the adjustment brackets has the distance between its respective ends selectively determined to determine the distance between the pairs of columns to which it is connected and thereby the spacing between the pairs of columns.

BRIEF DESCRIPTION OF THE DRAWINGS

FIG. 2 is a cross-sectional view of the dual relay rack taken on Line 2—2 of FIG. 1 showing in phantom view a portion of the relay rack in a fully-extended position;

FIG. 3 is an enlarged outside elevational view of an adjustment bracket of the dual relay rack shown in a closed attitude;

FIG. 4 is an enlarged outside view of the adjustment bracket shown in FIG. 3, but shown in an extended attitude;

FIG. 5 is an enlarged cross-sectional view taken along Line 5—5 of FIG. 2 of the adjustment bracket of FIG. 3 in its closed attitude;

FIG. 6 is an enlarged cross-sectional view taken along Line 5—5 of FIG. 2 of the adjustment bracket of FIG. 3 in an extended attitude;

DETAILED DESCRIPTION

Figure 1:
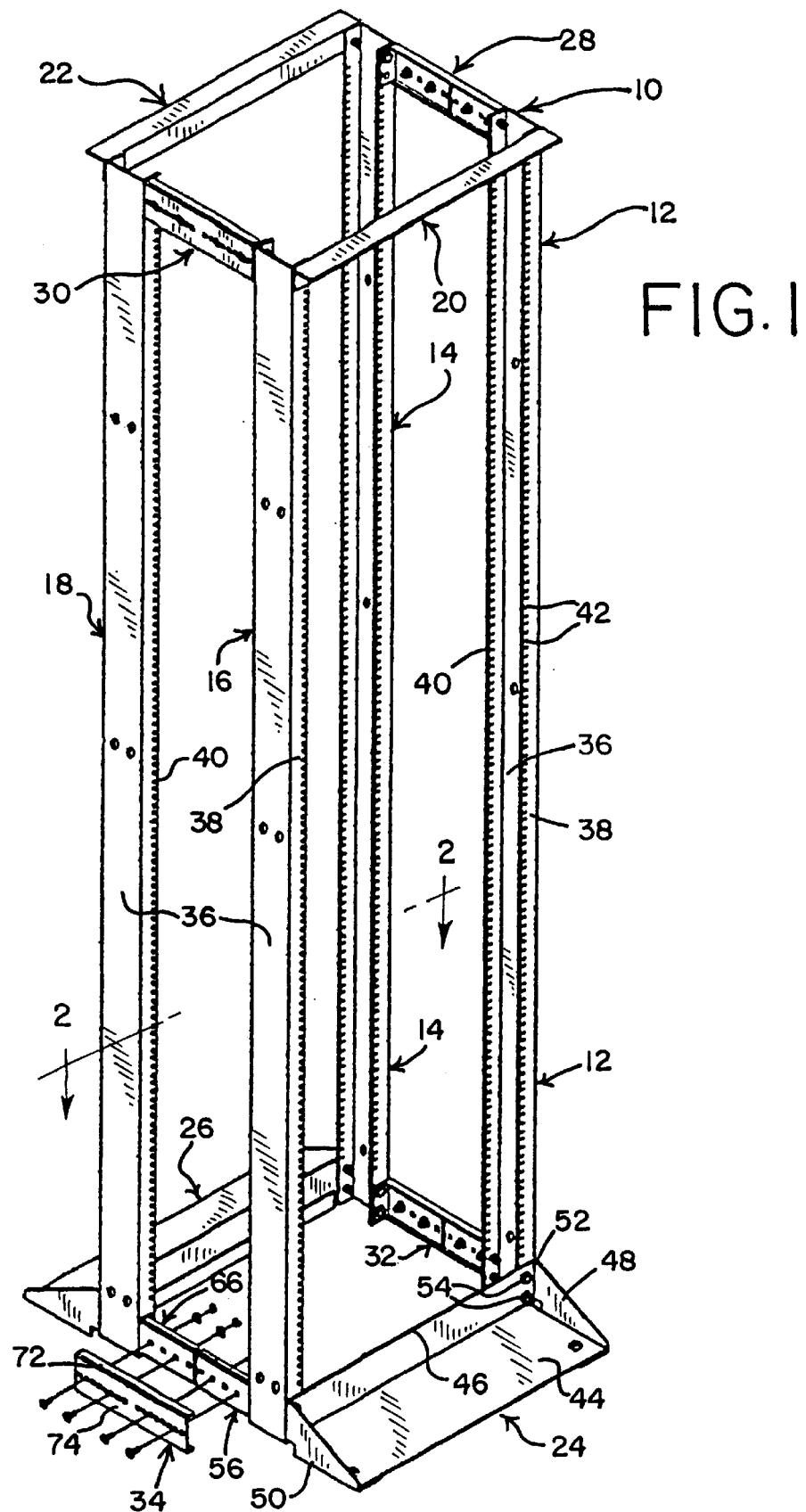
FIG. 1 is a perspective view of an adjustable communications equipment dual relay rack embodying the herein disclosed invention.

Referring now to the drawings and especially to FIG. 1, an adjustable communications equipment dual relay rack embodying the herein disclosed invention is shown therein and is generally indicated by numeral 10. The dual relay rack generally includes four spaced apart upright U-channel columns, 12, 14, 16 and 18. The columns are connected in pairs, in that, columns 12 and 16 are connected at their respective upper portions by an upper columnar connector bracket 20, and columns 14 and 18 are connected at their respective upper portions by an upper columnar connector bracket 22. The respective lower portions of columns 12 and 16 are connected by a foot 24. Columns 14 and 18 have their respective lower portions connected by a foot 26. The pair of upright columns 12 and 16 defines a vertical plane. The pair of columns 14 and 18 define a second vertical plane substantially parallel to the vertical plane of columns 12 and 16. The distance between the vertical planes is determined by four adjustment brackets. Upper adjustment bracket 28 is connected to the upper end of the pair of opposed columns, that is, adjustment bracket 28 has one end connected to the upper end of column 12 and the opposite end connected to the upper end of column 14. Upper adjustment bracket 30 has one end connected to the upper end of column 16, and the opposite end connected to the upper end of column 18.

Lower adjustment brackets 32 and 34 are connected to the lower portion of the respective columns. Lower adjustment bracket 32 had one end connected to the lower portion of column 12 and the opposite end connected to the lower portion of opposed column 14. Lower adjustment bracket 34 has one end connected to the lower portion of column 16 and the opposite end connected to the lower portion of opposed column 18. By the proper positioning of the elements of the adjustment brackets as described hereinafter, the distance between the planes defined by the pairs of columns may be determined and thus, the distance between columns 12 and 14 and columns 16 and 18

Each of the columns is identical in construction to each of the other columns. Each column includes a web 36 with a columnar outer flange 38 formed integral with the outer edge of web 36. A columnar inner flange 40 is formed integral with the opposite edge of web 36. Each of the outer and inner flanges has a plurality of columnar mounting apertures 42 formed therein as is conventional to receive fasteners for supporting equipment on the columns.

As may be seen in FIGS. 1 and 2, webs 36 of column 16 and 18 are parallel to each other and in the same plane. Webs 36 of columns 12 and 14 are parallel to each other and in the same plane parallel to the plane of the webs of columns 16 and 18.

The upper columnar connector bracket 20 is an angle bar having a pair of fastener apertures on one flange. Conventional fasteners are mounted in the apertures of upper columnar connector bracket 20 and in selected columnar mounting apertures in the columnar outer flange 38 of columns 12 and 16, thus securing the upper ends of columns 12 and 16 to each other. In a like manner, upper columnar connector bracket 22 has a pair of fastener apertures identical to those in bracket 20. Conventional fasteners are mounted in the fastener apertures of bracket 22 and in the columnar mounting apertures of the columnar outer flanges of columns 14 and 18 to secure the upper ends of columns 14 and 18 to each other.

Feet 24 and 26 and have an identical construction to each other. Each foot includes a foot base 44 with a foot bracket or lower columnar connector bracket 46 formed integral therewith and being generally perpendicular to foot base 44. Foot braces 48 and 50 are secured to base 44 and to the ends of connector bracket 46 to reinforce the connector bracket.

The lower columnar connector bracket 46 has a pair of mounting apertures 52 at each end which are aligned with selected columnar mounting apertures 42 on the columnar outer flange 38 of columns 12 and 16. Conventional bolts 54 are mounted in the aligned apertures to secure the lower columnar connector bracket 46 to the lower portion of columns 12 and 16. In a like manner, foot 26 is secured to the columnar outer flanges of columns 14 and 18. The foot 26 has its mounting apertures 52 aligned with columnar mounting apertures on the columnar outer flanges. Bolts 54 are mounted in the aligned apertures to secure the lower columnar connector bracket of foot 26 to the lower portion of columns 14 and 18.

Figure 7:
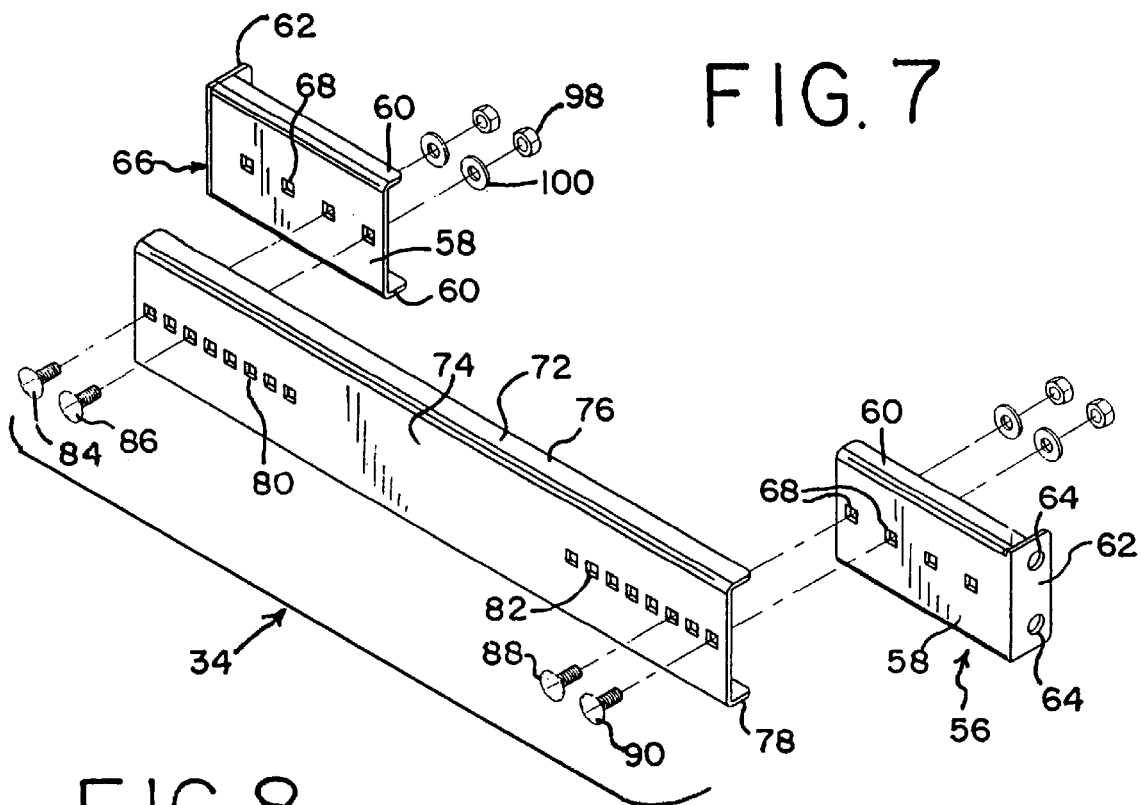
FIG. 7 is a perspective exploded view of the adjustment bracket of FIG. 3.

The adjustment brackets 28, 30, 32 and 34 each have an identical construction to each other. The following description of the construction of lower adjustable bracket 34 and shown in exploded view in FIG. 7 is applicable to each of the other adjustable brackets. Adjustment bracket 34 includes a U-channel beam 56 which includes a beam web 58 and beam flanges 60 formed integral at the opposite edges of the web. A ledge 62 is formed integral with one end of web 58. Ledge 62 includes a pair of beam mounting apertures 64 which are aligned with column mounting apertures on the columnar inner flange of column 16. A second U-channel beam 66 has an identical construction to beam 56, in that, it also includes a beam web 58 with flanges 60 formed integral with opposite end edges of the web. A ledge 62 is formed integral with the end of web 58. The ledge 62 of beam 66 also contain a pair of mounting apertures. Each of the webs 58 of beams 56 and 66 had four identical square beam adjustment apertures 68 formed therein. The beam adjustment apertures 68 on each of the webs are in a straight line positioned in the middle of the web.

Beam 66 is secured to column 18 by a pair of conventional bolts 70 which extend through mounting apertures 64 and selected columnar mounting apertures on the columnar inner flange of column 18. In a like manner, beam 56 is secured to the columnar inner flange of the column 16.

Beams 56 and 66 are connected to each other by a channel bridge 72, which is a U-shaped channel that mateably receives beams 56 and 66. Bridge 72 includes a bridge web 74 with bridge flanges 76 and 78 formed integral with opposite edges of web 74. Bridge 72 has a first group of bridge adjustment apertures 80 aligned in a straight line in the middle of the web, as may be seen in FIG. 7. Bridge 72 has a second group of bridge adjustment apertures 82 at the opposite end of the web aligned in a straight line and positioned in the center of the web. The apertures 68 in beams 56 and 66 and apertures 80 and 82 in the bridge are square and are the same size.

Figure 8:
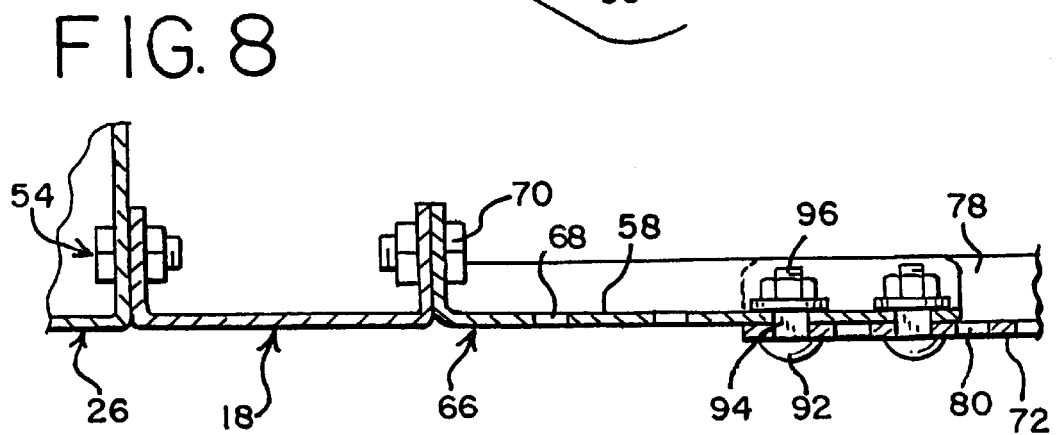
FIG. 8 is a cross sectional view through the adjustment bracket taken on Line 8—8 of FIG. 4.
Figure 9:
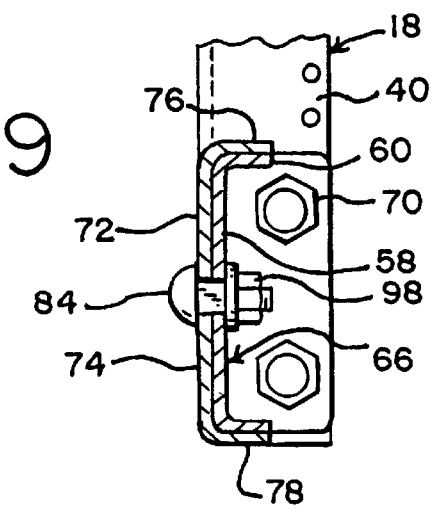
FIG. 9 is a cross sectional view through the adjustment bracket taken of Line 9—9 of FIG. 3.

Four conventional carriage bolts 84, 86, 88 and 90 secure the bridge 72 to beams 56 and 66. Each of the carriage bolts, shown in FIG. 8, has the same construction, in that, each bolt has a head 92 with a square shank 94 adjacent to the head and a threaded portion 96 extending from the square shank. The bolts are held in place by conventional nuts 98 which are mounted on each threaded portion 96 with a washer 100 between the beam and the respective nut.

The subject relay rack 10 may have its depth adjusted as needed to accommodate a variety of telephone equipment. The minimum depth of the relay rack is shown in FIG. 2 and the expanded portion is shown in phantom view in FIG. 2. FIGS. 3 and 5 show the attitude of the adjustment bracket 34 in its position holding the opposed columns 16 and 18 with the minimum distance between the columns. In order to expand the distance between the columns, the bolts are removed from their bridge adjustment apertures and beam adjustment apertures. The distance between columns 16 and 18 is extended and may be extended to the attitude shown in FIGS. 4 and 6. The bolts are mounted in the apertures in the bridge and the beams as shown in FIGS. 4 and 6. Since the bolts have a square shank which mate with the adjustment apertures, it is a simple matter to tighten the nut on the bolts. It is not necessary to have two workmen to make the adjustment, rather one workman alone may make the adjustment. Upper adjustment bracket 30 is adjusted in a similar manner. The lower adjustment bracket 32 is also adjusted to the same attitude as the adjustment bracket 34. The upper adjustment bracket 28 is adjusted to the same attitude as the remaining adjustment brackets. The completion of the adjustment brackets places the columns at a selected distance apart so that the vertical planes of each of the pairs of columns is set at a selected spaced apart attitude. Although adjustment has been described as adjusting the lower adjustment brackets first on either side, the upper adjustment brackets may be adjusted first on either side.

It is readily apparent that although the maximum expansion has been shown herein, intermediate expansion from that shown in FIGS. 3 and 5 may be adjusted by the adjustment of the position of the apertures on the beams relevant to apertures on the bridge. The adjustment of the depth of the dual relay rack is effected with a minimum of labor. The dual relay rack provides a sturdy support for communications equipment of a variety of sizes.

Although a detailed description of the subject invention is set forth above in the light of detailed drawings, it is readily apparent that those skilled in the art may make various modifications and changes within the scope of the present invention. It is to be expressly understood that the subject invention is limited by the appended claims.

What is claimed is:

1. An adjustable communications equipment dual relay rack, comprising, in combination, four spaced apart upright columns substantially parallel to each other, an upper columnar connector bracket connected to an upper portion of each column of a pair of columns to form two pairs of columns, each of the pairs of columns defining a substantially vertical plane, said upper columnar connector brackets being substantially parallel to each other, a lower columnar connector bracket connected to a lower portion of each column of each of said pairs of columns, said lower columnar connector brackets being parallel to each other and parallel to the upper columnar connector brackets, and four straight line adjustment brackets connected to the two pairs of columns, two of said adjustment brackets being lower adjustment brackets, each of said lower adjustment bracket having one end connected to a lower portion of one of the columns of one pair of columns and an opposite end connected to the lower portion of one of the columns of the other pair of columns, two of said adjustment brackets being upper adjustment brackets, each of said upper adjustment brackets having one end connected to the upper portion of one of the columns of a pair of columns and an opposite end of each of said two upper adjustment brackets connected to the upper portion of one of the columns of the other pair of columns, the distance between the respective one end and opposite end of each of said adjustment brackets being selective to determine the distance between the vertical planes of the pairs of columns.

2. An adjustable communications equipment dual relay rack comprising, in combination, four spaced apart upright columns substantially parallel to each other, an upper columnar connector bracket connected to an upper portion of each column of a pair of columns to form two pairs of columns, each of the pairs of columns defining a substantially vertical plane, said upper columnar connector brackets being substantially parallel to each other, a lower columnar connector bracket connected to a lower portion of each column of each of said pairs of columns, said lower columnar connector brackets being parallel to each other and parallel to the upper columnar connector brackets, and four adjustment brackets connected to the two pairs of columns, two of said adjustment brackets being lower adjustment brackets, each of said lower adjustment bracket having one end connected to a lower portion of one of the columns of one pair of columns and an opposite end connected to the lower portion of one of the columns of the other pair of columns, two of said adjustment brackets being upper adjustment brackets, each of said upper adjustment brackets having one end connected to the upper portion of one of the columns of a pair of columns and an opposite end of each of said two upper adjustment brackets connected to the upper portion of one of the columns of the other pair of columns, the distance between the respective one end and opposite end of each of said adjustment brackets being selective to determine the distance between the vertical planes of the pairs of columns, wherein each adjustment bracket includes; a beam having one end secured to one of the columns of a pair of columns, a second beam secured to a column of the other pair of columns, and a bridge connected to a selected portion of each of the respective beams to determine selectively the distance between the vertical planes of the pairs of columns.

3. An adjustable communications equipment dual relay rack comprising, in combination, four spaced apart upright columns substantially parallel to each other, an upper columnar connector bracket connected to an upper portion of each column of a pair of columns to form two pairs of columns, each of the pairs of columns defining a substantially vertical plane, said upper columnar connector brackets being substantially parallel to each other, a lower columnar connector bracket connected to a lower portion of each column of each of said pairs of columns, said lower columnar connector brackets being parallel to each other and parallel to the upper columnar connector brackets, and four adjustment brackets connected to the two pairs of columns, two of said adjustment brackets being lower adjustment brackets, each of said lower adjustment bracket having one end connected to a lower portion of one of the columns of one pair of columns and an opposite end connected to the lower portion of one of the columns of the other pair of columns, two of said adjustment brackets being upper adjustment brackets, each of said upper adjustment brackets having one end connected to the upper portion of one of the columns of a pair of columns and an opposite end of each of said two upper adjustment brackets connected to the upper portion of one of the columns of the other pair of columns, the distance between the respective one end and opposite end of each of said adjustment brackets being selective to determine the distance between the vertical planes of the pairs of columns, wherein each adjustment bracket includes; a channel beam having one end secured to one of the columns of a pair of columns, a second channel beam secured to a column of the other pair of columns, and a channel bridge mateably connected to a selected portion of each of the channel beams to determine selectively the distance between the vertical planes of the pairs of columns.

4. An adjustable communications equipment dual relay rack comprising, in combination, four spaced apart upright columns substantially parallel to each other, an upper columnar connector bracket connected to an upper portion of each column of a pair of columns to form two pairs of columns, each of the pairs of columns defining a substantially vertical plane, said upper columnar connector brackets being substantially parallel to each other, a lower columnar connector bracket connected to a lower portion of each column of each of said pairs of columns, said lower columnar connector brackets being parallel to each other and parallel to the upper columnar connector brackets, and four adjustment brackets connected to the two pairs of columns, two of said adjustment brackets being lower adjustment brackets, each of said lower adjustment bracket having one end connected to a lower portion of one of the columns of one pair of columns and an opposite end connected to the lower portion of one of the columns of the other pair of columns, two of said adjustment brackets being upper adjustment brackets, each of said upper adjustment brackets having one end connected to the upper portion of one of the columns of a pair of columns and an opposite end of each of said two upper adjustment brackets connected to the upper portion of one of the columns of the other pair of columns, the distance between the respective one end and opposite end of each of said adjustment brackets being selective to determine the distance between the vertical planes of the pairs of columns, wherein each of said upright columns is a U-channel having a web, an inner flange formed integral with one side of each web, an outer flange formed integral with an opposed side of each web and parallel to the inner flange, each of said flanges having a plurality of columnar mounting apertures, said adjustment brackets being connected to the inner flanges of the respective columns.

5. An adjustable communications equipment dual relay rack comprising, in combination, four spaced apart upright columns substantially parallel to each other, an upper columnar connector bracket connected to an upper portion of each column of a pair of columns to form two pairs of columns, each of the pairs of columns defining a substantially vertical plane, said upper columnar connector brackets being substantially parallel to each other, a lower columnar connector bracket connected to a lower portion of each column of each of said pairs of columns, said lower columnar connector brackets being parallel to each other and parallel to the upper columnar connector brackets, and four adjustment brackets connected to the two pairs of columns, two of said adjustment brackets being lower adjustment brackets, each of said lower adjustment bracket having one end connected to a lower portion of one of the columns of one pair of columns and an opposite end connected to the lower portion of one of the columns of the other pair of columns, two of said adjustment brackets being upper adjustment brackets, each of said upper adjustment brackets having one end connected to the upper portion of one of the columns of a pair of columns and an opposite end of each of said two upper adjustment brackets connected to the upper portion of one of the columns of the other pair of columns, the distance between the respective one end and opposite end of each of said adjustment brackets being selective to determine the distance between the vertical planes of the pairs of columns, wherein each of said upright columns is a U-channel, each U-channel having a web, an inner flange formed integral with one edge of the web, an outer flange formed integral with an opposed edge of the web and being parallel to the inner flange, each of said flanges having a plurality of columnar mounting apertures, said adjustment brackets being connected to the inner flanges of the respective columns, the web of each of the columns in the first pair of columns being in substantially the same plane as the web of a respective column in the second pair of columns, and a foot mounted on the outer flanges of the columns in each of each of the pairs of columns.

6. An adjustable communiciations equipment dual relay rack, comprising, in combination, a first pair of upright columns substantially parallel to each other, a second pair of upright columns substantially parallel to each other and to the columns of the first pair, an upper connector bracket secured to an upper portion of each column of each pair of columns to connect the columns into pairs, said upper connector brackets being parallel to each other, a lower connector bracket connected to a lower portion of each column of each pair of columns, said lower connector brackets being parallel to each other and to the upper connector brackets of the respective pair of columns, four adjustment brackets connecting the two pairs of columns, two of said adjustment brackets being lower adjustment brackets, each of said lower adjustment brackets having one end connected to a lower portion of one of the columns of one of said first pair of columns and an opposite end connected to the lower portion of one of the columns of the second pair of columns, two of said adjustment brackets being upper adjustment brackets, each of said upper adjustment brackets having one end connected to the upper portion of one of the columns of the first pair of columns and an opposite end connected to the upper portion of one of the columns of the second pair of columns, each of said adjustment brackets being substantially parallel to the other adjustment brackets, each of said adjustable brackets including; a first beam having one end secured to a column of the first pair of columns, a second beam parallel to and aligned with the first beam secured to a column of the second pair of columns, each of said beams being a channel beam, each channel beam having a beam web, a plurality of beam fastener apertures in each beam web arranged in a line perpendicular to the respective column, a channel bridge mateably connected to the respective first and second beams, said channel bridge having a bridge web, a plurality of bridge fastener apertures in said bridge web in a line substantially parallel to the line of beam fastener apertures in each of the beams, a first fastener mounted in a bridge fastener aperture and a beam fastener aperture in the first beam, and a second fastener mounted in a second bridge fastener aperture and a beam fastener aperture in the second beam selectively determining the distance between the respective columns.

7. An adjustable communications equipment dual relay rack, as defined in claim 6, wherein each of the beam fastener apertures and the bridge fastener apertures is square, and each of the fasteners is a carriage bolt having a head and a square portion adjacent to the head being mateably mounted in selected square apertures.

8. An adjustable communications equipment dual relay rack, as defined in claim 6, wherein each web of each of the beams and the bridge of a respective adjustment bracket is parallel to the respective columns connected by the adjustment rack.

9. An adjustable communications equipment dual relay rack, as defined in claim 6, wherein each of the upright columns is a U-channel having a web, an inner flange formed integral with one edge of the web, an outer flange formed integral with an opposed edge of the web and being substantially parallel to the inner flange, each column in the first pair of columns having its web in substantially the same plane as the web of a respective column in the second pair of columns, and a connector bracket mounted on the outer edge of each of the columns in a respective pair.

10. An adjustable communications equipment dual relay rack, as defined in claim 6, wherein each of the upright columns is a U-channel, each U-channel having a web, an inner flange formed integral with one edge of each web, and an outer flange formed integral with an opposed edge of each web, the web of each column in the first pair of columns being substantially in the same plane as the web of an adjacent column in the second pair of columns.

11. An adjustable communications equipment dual relay rack, comprising, in combination, four spaced apart upright columns substantially parallel to each other, a columnar connector bracket having one end secured to each column of a pair of columns in substantially the same plane to form two pairs of columns, each of the pairs of columns defining a substantially vertical plane, said columnar connector brackets being substantially parallel to each other, an adjustment bracket connected to each of opposed columns in opposed vertical planes of the two pairs of columns, each of said adjustment brackets having one end secured to a column of a pair of columns, an opposite end of each of the adjustment brackets secured to an opposed column of the other pair of columns, bridge beams between said adjustment brackets, said bridge beams and said adjustment brackets having cross sectional shapes that are similar to one another allowing said brackets and bridge beams to nest together, said adjustment brackets being substantially parallel to each other, each of said adjustment brackets having the distance between each respective one end and the respective opposed end selective to determine the distance between the vertical planes of the pairs of columns.

12. An adjustable communications equipment dual relay rack comprising, in combination, four spaced apart upright columns substantially parallel to each other, a columnar connector bracket having one end secured to each column of a pair of columns in substantially the same plane to form two pairs of columns, each of the pairs of columns defining a substantially vertical plane, said columnar connector brackets being substantially parallel to each other, an adjustment bracket connected to each of opposed columns in opposed vertical planes of the two pairs of columns, each of said adjustment brackets having one end secured to a column of a pair of columns, an opposite end of each of the adjustment brackets secured to an opposed column of the other pair of columns, bridge beams between said adjustment brackets, said bridge beams and said adjustment brackets having cross sectional shapes that are similar to one another allowing said brackets and bridge beams to nest together, said adjustment brackets being substantially parallel to each other, each of said adjustment brackets having the distance between each respective one end and the respective opposed end selective to determine the distance between the vertical planes of the pairs of columns, each adjustment bracket includes; a first beam having one end secured to a column of the first pair of columns, a second beam having an end secured to a column of a second pair of columns, and a bridge mateably connected to a selected portion of the first beam and to a second selected portion of the second beam to determine the distance between the vertical planes of the pairs of columns.

13. An adjustable communications equipment dual relay rack comprising, in combination, four spaced apart upright columns substantially parallel to each other, a columnar connector bracket having one end secured to each column of a pair of columns in substantially the same plane to form two pairs of columns, each of the pairs of columns defining a substantially vertical plane, said columnar connector brackets being substantially parallel to each other, an adjustment bracket connected to each of opposed columns in opposed vertical planes of the two pairs of columns, each of said adjustment brackets having one end secured to a column of a pair of columns, an opposite end of each of the adjustment brackets secured to an opposed column of the other pair of columns, bridge beams between said adjustment brackets, said bridge beams and said adjustment brackets having cross sectional shapes that are similar to one another allowing said brackets and bridge beams to nest together, said adjustment brackets being substantially parallel to each other, each of said adjustment brackets having the distance between each respective one end and the respective opposed end selective to determine the distance between the vertical planes of the pairs of columns, each adjustment bracket includes; a first channel beam having one end secured to one of the columns of a pair of columns, a second channel beam having an opposite end secured to a column of the other pair of columns, said second channel beam being aligned with the first channel beam, and a channel bridge mateably connected to a selected portion of each of the channel beams to determine the distance between the vertical planes of the pairs of columns.

14. An adjustable communications equipment dual relay rack comprising, in combination, four spaced apart upright columns substantially parallel to each other, a columnar connector bracket having one end secured to each column of a pair of columns in substantially the same plane to form two pairs of columns, each of the pairs of columns defining a substantially vertical plane, said columnar connector brackets being substantially parallel to each other, an adjustment bracket connected to each of opposed columns in opposed vertical planes of the two pairs of columns, each of said adjustment brackets having one end secured to a column of a pair of columns, an opposite end of each of the adjustment brackets secured to an opposed column of the other pair of columns, bridge beams between said adjustment brackets, said bridge beams and said adjustment brackets having cross sectional shapes that are similar to one another allowing said brackets and bridge beams to nest together, said adjustment brackets being substantially parallel to each other, each of said adjustment brackets having the distance between each respective one end and the respective opposed end selective to determine the distance between the vertical planes of the pairs of columns, each of said upright columns is a U-channel having a web, an inner flange formed integral with one edge of each web, an outer flange formed integral with an opposed edge of each web, each of said flanges having a plurality of columnar mounting apertures, said adjustment brackets being connected to the inner flange of the respective columns, each of the webs in a column of the first pair of columns being in substantially the same plane as the web of a respective column in the second pair of columns.

15. An adjustable communications equipment dual relay rack comprising, in combination, four spaced apart upright columns substantially parallel to each other, a columnar connector bracket having one end secured to each column of a pair of columns in substantially the same plane to form two pairs of columns, each of the pairs of columns defining a substantially vertical plane, said columnar connector brackets being substantially parallel to each other, an adjustment bracket connected to each of opposed columns in opposed vertical planes of the two pairs of columns, each of said adjustment brackets having one end secured to a column of a pair of columns, an opposite end of each of the adjustment brackets secured to an opposed column of the other pair of columns, bridge beams between said adjustment brackets, said bridge beams and said adjustment brackets having cross sectional shapes that are similar to one another allowing said brackets and bridge beams to nest together, said adjustment brackets being substantially parallel to each other, each of said adjustment brackets having the distance between each respective one end and the respective opposed end selective to determine the distance between the vertical planes of the pairs of columns, each of said adjustment brackets includes; a first beam having one end secured to a column of the first pair of columns, a second beam having an opposite end secured to a column of a second pair of columns, each of said beams being a channel having a beam web, each of said beam webs including a plurality of beam fastener apertures arranged in a line perpendicular to the respective column, a channel bridge mateably connected to the first and second beams, said channel bridge having a bridge web, a plurality of bridge fastener apertures in said bridge web in a line substantially parallel to the line of beam fastener apertures in the first beam and the second beam, a first fastener mounted in a bridge fastener aperture in the bridge web and a beam fastener aperture in the first beam, and a second fastener mounted in a second bridge fastener aperture in the bridge web and a beam fastener aperture in the second beam determining the distance between the vertical planes of the pairs of columns.

\* \* \* \* \*